US011649560B2

(12) United States Patent
Sanchez et al.

(10) Patent No.: US 11,649,560 B2
(45) Date of Patent: May 16, 2023

(54) METHOD FOR FORMING SILICON-PHOSPHOROUS MATERIALS

(71) Applicant: Applied Materials, Inc., Santa Clara, CA (US)

(72) Inventors: Errol Antonio C Sanchez, Tracy, CA (US); Mark J. Saly, Santa Clara, CA (US); Schubert Chu, San Francisco, CA (US); Abhishek Dube, Fremont, CA (US); Srividya Natarajan, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 783 days.

(21) Appl. No.: 16/530,641

(22) Filed: Aug. 2, 2019

(65) Prior Publication Data

US 2020/0399784 A1    Dec. 24, 2020

Related U.S. Application Data

(60) Provisional application No. 62/864,260, filed on Jun. 20, 2019.

(51) Int. Cl.
| | |
|---|---|
| *H01L 21/00* | (2006.01) |
| *C30B 29/54* | (2006.01) |
| *C07F 9/50* | (2006.01) |
| *H01L 29/08* | (2006.01) |
| *H01L 21/02* | (2006.01) |
| *C30B 25/02* | (2006.01) |

(52) U.S. Cl.
CPC ............ *C30B 29/54* (2013.01); *C07F 9/5009* (2013.01); *C30B 25/02* (2013.01); *H01L 21/0262* (2013.01); *H01L 21/02521* (2013.01); *H01L 29/0843* (2013.01)

(58) Field of Classification Search
CPC ....................................................... H01L 21/00
See application file for complete search history.

(56) References Cited

U.S. PATENT DOCUMENTS

| | | | |
|---|---|---|---|
| 6,391,932 B1 | 5/2002 | Gore et al. | |
| 6,527,847 B1 | 3/2003 | Matsuki | |
| 6,599,447 B2 | 7/2003 | Stauf et al. | |
| 7,071,125 B2 | 7/2006 | McSwiney et al. | |
| 7,439,179 B2 | 10/2008 | Goodner | |
| 7,563,727 B2 | 7/2009 | Goodner | |
| 7,601,652 B2 | 10/2009 | Singh et al. | |
| 7,648,927 B2 | 1/2010 | Singh et al. | |
| 7,674,926 B1 | 3/2010 | Guo et al. | |
| 8,236,381 B2 | 8/2012 | Okubo | |
| 8,387,557 B2 | 3/2013 | Singh et al. | |
| 8,591,762 B2 | 11/2013 | Lievens et al. | |
| 8,618,556 B2 | 12/2013 | Wu et al. | |
| 8,636,845 B2 | 1/2014 | Gatineau et al. | |
| 8,691,668 B2 | 4/2014 | Gatineau et al. | |
| 8,802,194 B2 | 8/2014 | Ishii et al. | |
| 8,963,248 B2 | 2/2015 | Basker et al. | |
| 9,382,269 B2 | 7/2016 | Sanchez et al. | |
| 9,842,929 B1 | 12/2017 | Cheng et al. | |
| 2001/0000866 A1 | 5/2001 | Sneh et al. | |
| 2001/0020712 A1 | 9/2001 | Raaijmakers et al. | |
| 2001/0024387 A1 | 9/2001 | Raaijmakers et al. | |
| 2002/0173113 A1 | 11/2002 | Todd | |
| 2006/0063394 A1* | 3/2006 | McSwiney | C23C 16/22 438/783 |
| 2008/0012124 A1 | 1/2008 | Stapleton et al. | |
| 2009/0162973 A1 | 6/2009 | Gatineau et al. | |
| 2010/0018460 A1* | 1/2010 | Singh | C23C 16/0227 118/620 |
| 2011/0108777 A1 | 5/2011 | Schulz et al. | |
| 2011/0178321 A1 | 7/2011 | Guo et al. | |
| 2012/0145321 A1 | 6/2012 | Stapleton et al. | |
| 2013/0168824 A1 | 7/2013 | Wieber et al. | |
| 2013/0244383 A1 | 9/2013 | Stapleton et al. | |
| 2013/0323435 A1 | 12/2013 | Xiao et al. | |
| 2014/0158580 A1 | 6/2014 | Xiao et al. | |
| 2015/0094470 A1* | 4/2015 | Sanchez | C07F 7/025 548/950 |
| 2015/0214364 A1 | 7/2015 | Chan et al. | |
| 2015/0246937 A1 | 9/2015 | Xiao et al. | |
| 2015/0311120 A1 | 10/2015 | Shintri et al. | |
| 2017/0358677 A1* | 12/2017 | Cheng | H01L 21/823807 |
| 2018/0286961 A1 | 10/2018 | Bao et al. | |

FOREIGN PATENT DOCUMENTS

WO    2007137074 A2    11/2007

OTHER PUBLICATIONS

International Search Report and Written Opinion dated Aug. 26, 2020.
G. Fritz, et al., Silylphosphanes: Developments in Phosphorous Chemistry, Chem. Rev. 2000, 100, 3341-3401.

* cited by examiner

*Primary Examiner* — David P Turocy
*Assistant Examiner* — Mohammad Mayy
(74) *Attorney, Agent, or Firm* — Patterson + Sheridan, LLP

(57) ABSTRACT

Embodiments generally relate to methods for depositing silicon-phosphorous materials, and more specifically, relate to using silicon-phosphorous compounds in vapor deposition processes (e.g., epitaxy, CVD, or ALD) to deposit silicon-phosphorous materials. In one or more embodiments, a method for forming a silicon-phosphorous material on a substrate is provided and includes exposing the substrate to a deposition gas containing one or more silicon-phosphorous compounds during a deposition process and depositing a film containing the silicon-phosphorous material on the substrate. The silicon-phosphorous compound has the chemical formula $[(R_{3-v}H_vSi)-(R_{2-w}H_wSi)_n]_xPH_yR'_z$, where each instance of R and each instance of R' are independently an alkyl or a halogen, n is 0, 1, or 2; v is 0, 1, 2, or 3; w is 0, 1, or 2; x is 1, 2, or 3; y is 0, 1, or 2; z is 0, 1, or 2, and where x+y+z=3.

18 Claims, No Drawings

METHOD FOR FORMING SILICON-PHOSPHOROUS MATERIALS

CROSS-REFERENCE TO RELATED APPLICATIONS

This application claims benefit of U.S. Appl. No. 62/864,260, filed on Jun. 20, 2019, which is herein incorporated by reference.

BACKGROUND

Field

Embodiments of the present disclosure generally relate to the field of semiconductor manufacturing, display technology, and other micro electronic industries, and more specifically, to methods for depositing silicon-containing materials.

Description of the Related Art

As smaller and more complex electronic devices are manufactured, better doping of dielectric and crystalline materials for a variety of applications are needed to enhance device performance. The desired sets of properties of phosphorous and arsenic containing silicon-based materials are becoming more difficult to achieve due to the evolving processing limitations of the micro electronic industry. For example, selective area deposition of epitaxial silicon or silicon-containing materials having a high level of strain and a low resistivity has become difficult at lower temperatures (less than 500° C.). In some cases, conformal dielectric films having uniform doping over high aspect ratio features are challenging. Also, although lower temperatures are desirable during the deposition, the growth rate and active dopant levels of the deposited film undesirably reduces at the lower temperatures. Doping profile control is also difficult due to the diffusion of the dopant (e.g., P or As) during thermal process steps.

Therefore, improved methods for depositing silicon-containing materials are desired.

SUMMARY OF THE INVENTION

Embodiments generally relate to methods for depositing silicon-phosphorous materials, and more specifically, relate to using silicon-phosphorous compounds in vapor deposition processes to deposit silicon-phosphorous materials.

In one or more embodiments, a method for forming a silicon-phosphorous material on a substrate is provided and includes exposing the substrate to a deposition gas containing one or more silicon-phosphorous compounds during a deposition process and depositing a film containing the silicon-phosphorous material on the substrate. The silicon-phosphorous compound has the chemical formula:

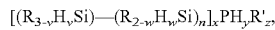

$[(R_{3-v}H_vSi)-(R_{2-w}H_wSi)_n]_xPH_yR'_z$, where each instance of R is independently an alkyl or a halogen, each instance of R' is independently an alkyl or a halogen, n is 0, 1, or 2; v is 0, 1, 2, or 3; w is 0, 1, or 2; x is 1, 2, or 3; y is 0, 1, or 2; and z is 0, 1, or 2, where x+y+z=3.

In some embodiments, a method for forming a silicon-phosphorous material on a substrate is provided and includes exposing the substrate in the processing chamber to the deposition gas containing one or more silicon-phosphorous compounds during an epitaxy or epitaxial process and selectively depositing the film containing the silicon-phosphorous material on the substrate. The substrate can be heated to a temperature of about 400° C. to about 700° C. and the processing chamber can be maintained at a pressure of about 20 Torr to about 600 Torr.

In other embodiments, a method for forming a silicon-phosphorous material on a substrate is provided and includes exposing the substrate in the processing chamber to the deposition gas containing one or more silicon-phosphorous compounds during an atomic layer deposition (ALD) process and depositing the film containing the silicon-phosphorous material on the substrate. The substrate can be heated to a temperature of about 100° C. to less than 400° C. and the processing chamber is maintained at a pressure of about 100 Torr or less.

In one or more embodiments, a computer program product residing on a computer-readable medium is provided and includes instructions for causing a processor to perform one or more methods for forming silicon-phosphorous materials on substrates, as described and discussed herein.

DETAILED DESCRIPTION

Embodiments generally relate to methods for depositing silicon-phosphorous materials, and more specifically, relate to using silicon-phosphorous compounds in vapor deposition processes to deposit silicon-phosphorous materials. The silicon-phosphorous compound includes at least one silicon-phosphorous bond that is preserved in the silicon-phosphorous material deposited or otherwise formed by deposition processes described and discussed herein. The layers or films containing the silicon-phosphorous material are deposited, grown, formed, or otherwise produced on one or more features disposed on the substrate. Exemplary features can be or include one or more source-drain features, one or more source-drain extensions, or other devices or features.

Some of the beneficial aspects provided by embodiments described and discussed here include: a relatively fast growth rate of the silicon-phosphorous materials; a relatively low deposition temperature (e.g., less than 500° C., such as 450° C. or 400° C.); a relative high concentration of phosphorous in the silicon-phosphorous materials which provides a relative low resistivity value of the silicon-phosphorous materials; and a stabilized phosphorus in the silicon-phosphorous materials (reduced phosphorous diffusion) due to the initial silicon-phosphorus bond in the silicon-phosphorous compound or precursor.

In one or more embodiments, a method for forming a silicon-phosphorous material on a substrate is provided and includes exposing the substrate to a deposition gas containing one or more silicon-phosphorous compounds during a deposition process and depositing a film containing the silicon-phosphorous material on the substrate. The deposition process can be one or more vapor deposition processes which are thermal processes or plasma processes. Exemplary vapor deposition processes can be or include an epitaxy, epitaxial, or atomic layer epitaxy (ALE) process, an atomic layer deposition (ALD) process, a plasma-enhanced ALD (PE-ALD) process, a chemical vapor deposition (CVD) process, a plasma-enhanced CVD (PE-CVD) process, or a plasma process thereof.

The silicon-phosphorous compound contains one or more silicon atoms, one or more phosphorous atoms, and one or more silicon-phosphorous bonds. Each silicon atom can be bonded to one or more hydrogen atoms, one or more organic groups, one or more halogen atoms, or a combination thereof. Similarly, each phosphorous atom can be bonded to one or more hydrogen atoms, one or more organic groups, one or more halogen atoms, or any combination thereof. The organic groups can be or include one or more alkyls, alkenes, alkynes, benzyls or aryls, as well as other functionalized organic groups. The halogen atoms can be fluorine, chlorine, bromine, iodine, or any combination thereof.

In some embodiments, the silicon-phosphorous compounds can be ex-situ the processing chamber. For example, a silicon-phosphorous compound can be acquired, purchased, or synthesized and then directly introduced into the processing chamber. Alternatively, in other embodiments, the silicon-phosphorous compounds can be in-situ the processing chamber. For example, one, two, or more precursors (e.g., one or more silanes or alkyl silanes and one or more phosphines or alkyl phosphines) can be injected into the processing chamber to produce the silicon-phosphorous compound therein. In one or more examples, one or more silicon sources (e.g., silane, disilane, trisilane, tetrasilane, methylsilane, tert-butylsilane, or any combination thereof) are combined with one or more phosphorous sources (e.g., trichlorophosphine ($PCl_3$)) to produce the silicon-phosphorous compound. The silicon-phosphorous compound can be produced in-situ the processing chamber prior to and/or during the deposition process. Silicon-phosphorous compounds or precursors useful in embodiments described and discussed herein, as well as synthesis processes useful for producing such compounds, are further described and discussed in the article G. Fritz, et al., *Silylphosphanes: Developments in Phosphorous Chemistry, Chem. Rev.* 2000, 100, 3341-3401, which is herein incorporated by reference in its entirety.

In one or more embodiments, the silicon-phosphorous compound has the chemical formula:

$$[(R_{3-v}H_vSi)-(R_{2-w}H_wSi)_n]_xPH_yR'_z,$$

where each instance of R is independently an organic group (e.g., alkyl) or a halogen atom (e.g., F, Cl, Br, or I), each instance of R' is independently an organic group (e.g., alkyl) or a halogen atom (e.g., F, Cl, Br, or I), n is 0, 1, or 2; v is 0, 1, 2, or 3; w is 0, 1, or 2; x is 1, 2, or 3; y is 0, 1, or 2; and z is 0, 1, or 2, where x+y+z=3. Each instance of R is independently selected from methyl, ethyl, propyl, butyl, pentyl, any isomer of these alkyls, fluoride, chloride, bromide, or iodide. Each instance of R' is independently selected from methyl, ethyl, propyl, butyl, pentyl, any isomer of these alkyls, fluoride, chloride, bromide, or iodide. In one or more examples, each instance of R and each instance of R' are independently selected from methyl, ethyl, propyl, butyl, pentyl, or isomers thereof. In some examples, each instance of R and each instance of R' are independently selected from methyl, ethyl, n-propyl, iso-propyl, n-butyl, sec-butyl, tert-butyl, n-pentyl, sec-pentyl, iso-pentyl, tert-pentyl, neo-pentyl, 3-pentyl, or sec-isopentyl.

In some embodiments, n is 0 and the silicon-phosphorous compound has the chemical formula $(R_{3-v}H_vSi)_xPH_yR'_z$. In some examples, n is 0 and x is 1, and the silicon-phosphorous compound has the chemical formula $(R_{3-v}H_vSi)PH_yR'_z$. Exemplary chemical formulas of the silicon-phosphorous compound when n is 0 and x is 1 include $R_3Si-PR'_2$; $R_3Si-PHR'$; $R_3Si-PH_2$; $R_2HSi-PR'_2$; $R_2HSi-PHR'$; $R_2HSi-PH_2$; $RH_2Si-PR'_2$; $RH_2Si-PHR'$; $RH_2Si-PH_2$; $H_3Si-PR'_2$; $H_3Si-PHR'$; or $H_3Si-PH_2$. The silicon-phosphorous compound can be or include one compound or a mixture of two or more compounds wherein each compound has a different chemical formula. In some examples, the silicon-phosphorous compound can be or include one or more of the following compounds: $H_3Si-PH_2$; $Me_2HSi-PH_2$; $MeEtHSi-PH_2$; $Me_2HSi-PHMe$; $tBuMe_2Si-PH_2$; $Me_2HSi-PH(tBu)$; $tBu_2HSi-PH_2$; $H_3Si-PMe_2$; $H_3Si-PEt_2$; $H_3Si-P(iPr)_2$; $H_3Si-P(tBu)_2$; $Cl_3Si-PMe_2$; $Cl_3Si-PEt_2$; $Cl_3Si-P(iPr)_2$; $Cl_3Si-P(tBu)_2$; $Br_3Si-PMe_2$; $Br_3Si-PEt_2$; $Br_3Si-P(iPr)_2$; $Br_3Si-P(tBu)_2$; $BrCl_2Si-PMe_2$; $Cl_3Si-PHMe$; $ClBr_2Si-PMe(tBu)$; $ICl_2Si-PMe_2$; $Cl_3Si-PEt_2$; $ClBr_2Si-P(iPr)H$; $I_3Si-PH(tBu)$; $ClBr_2Si-PHMe$; $Br_2HSi-PHEt$; $Br_2MeSi-PMe(iPr)$; $ClMe_2Si-PMe_2$; $H_3Si-PCl_2$; $Me_2HSi-PHCl$; $MeEtHSi-PBr_2$; $Me_2HSi-PMeCl$; $tBuMe_2Si-PClBr$; $ClH_2Si-PCl_2$; $Me_2ClSi-PHCl$; $MeClHSi-PBr_2$; $BrMeHSi-PMeCl$; or $tBuCl_2Si-PClBr$.

In other embodiments, n is 1 and the silicon-phosphorous compound has the chemical formula $[(R_{3-v}H_vSi)-(R_{2-w}H_wSi)]_x-PH_yR'_z$. In some examples, n is 1 and x is 1, and the silicon-phosphorous compound has the chemical formula $(R_{3-v}H_vSi)-(R_{2-w}H_wSi)-PH_yR'_z$. Exemplary chemical formulas of the silicon-phosphorous compound when n is 1 and x is 1 include $R_3Si-(R_2Si)-PR'_2$; $R_3Si-(R_2Si)-PHR'$; $R_3Si-(R_2Si)-PH_2$; $R_2HSi-(R_2Si)-PR'_2$; $R_2HSi-(R_2Si)-PHR'$; $R_2HSi-(R_2Si)-PH_2$; $RH_2Si-(R_2Si)-PR'_2$; $RH_2Si-(R_2Si)-PHR'$; $RH_2Si-(R_2Si)-PH_2$; $H_3Si-(R_2Si)-PR'_2$; $H_3Si-(R_2Si)-PHR'$; $H_3Si-(R_2Si)-PH_2$; $R_3Si-(H_2Si)-PR'_2$; $R_3Si-(H_2Si)-PHR'$; $R_3Si-(H_2Si)-PH_2$; $R_2HSi-(H_2Si)-PR'_2$; $R_2HSi-(H_2Si)-PHR'$; $R_2HSi-(H_2Si)-PH_2$; $RH_2Si-(H_2Si)-PR'_2$; $RH_2Si-(H_2Si)-PHR'$; $RH_2Si-(H_2Si)-PH_2$; $H_3Si-(H_2Si)-PR'_2$; $H_3Si-(H_2Si)-PHR'$; $H_3Si-(H_2Si)-PH_2$; $R_3Si-(RHSi)-PR'_2$; $R_3Si-(RHSi)-PHR'$; $R_3Si-(RHSi)-PH_2$; $R_2HSi-(RHSi)-PR'_2$; $R_2HSi-(RHSi)-PHR'$; $R_2HSi-(RHSi)-PH_2$; $RH_2Si-(RHSi)-PR'_2$; $RH_2Si-(RHSi)-PHR'$; $RH_2Si-(RHSi)-PH_2$; $H_3Si-(RHSi)-PR'_2$; $H_3Si-(RHSi)-PHR'$; or $H_3Si-(RHSi)-PH_2$.

In one or more embodiments, silicon-phosphorous compound has two silicon-phosphorous bonds (Si—P), such that two silicon atoms are directly bonded to one phosphorous atom. For example, x is 2; y is 0 or 1; and z is 0 or 1, where y+z=1, and the silicon-phosphorous compound has the chemical formula $[(R_{3-v}H_vSi)-(R_{2-w}H_wSi)_n]_2PH_yR'_z$. In some examples, the silicon-phosphorous compound can have any one of the following chemical formulas, such as $[(R_{3-v}H_vSi)-(R_{2-w}H_wSi)_n]_2PR'$, $[(R_{3-v}H_vSi)-(R_{2-w}H_wSi)_n]_2PH$, $(R_{3-v}H_vSi)_2PR'$, or $(R_{3-v}H_vSi)_2PH$.

In other embodiments, silicon-phosphorous compound has three silicon-phosphorous bonds, such that three silicon atoms are directly bonded to one phosphorous atom. For example, x is 3; y is 0; and z is 0, and the silicon-phosphorous compound has the chemical formula $[(R_{3-v}H_vSi)-(R_{2-w}H_wSi)_n]_3P$. In some examples, when n is 0, the silicon-phosphorous compound has the chemical formula $(R_{3-v}H_vSi)_3P$.

In one or more embodiments, besides including the silicon-phosphorous compound, the deposition gas can also contain one or more silicon source gases, one or more phosphorous source gases, one or more dopant source gases (e.g., arsenic or antimony), one or more etchant gases, one or more carrier gases, or any combination thereof. For example, in a selective epitaxy deposition, the deposition gas contains the silicon-phosphorous compound, one or more silicon source gases, one or more phosphorous source gases, optionally one or more arsenic source gases, one or more antimony source gases, one or more etchant gases, and one or more carrier gases.

The silicon source gas can be or include silane, disilane, trisilane, tetrasilane, pentasilane, chlorosilane, dichlorosilane, trichlorosilane, tetrachlorosilane, hexachlorodisilane, tetraethyl orthosilicate (TEOS), or any combination thereof. The phosphorous source gas can be or include phosphine, trichlorophosphine, methylphosphine, ethylphosphine, propylphosphine, butylphosphine, dimethylphosphine, diethylphosphine, dipropylphosphine, dibutylphosphine, trimethylphosphine, triethylphosphine, tripropylphosphine, tributylphosphine, alkyl isomers thereof, adducts thereof, or any combination thereof. If the dopant is arsenic, then the arsenic source gas can be or include arsine, methylarsine, ethylarsine, propylarsine, butylarsine, dimethylarsine, diethylarsine, dipropylarsine, dibutylarsine, trimethylarsine, triethylarsine, tripropylarsine, tributylarsine, alkyl isomers thereof, adducts thereof, or any combination thereof. If the dopant is antimony, then the antimony source gas can be or include trimethylantimony, triethylantimony, tripropylantimony, tris(dimethylamino)antimony, tris(diethylamino)antimony, antimony trichloride, antimony triiodide, antimony pentafluoride, antimony pentachloride, antimony(III) n-butoxide, antimony(III) ethoxide, or any combination thereof. The etchant gas can be or include chlorine ($Cl_2$), hydrogen chloride, an alkylchloride (e.g., methylchloride, methylene chlorine, carbon tetrachloride), boron trichloride, chlorotrifluoride, hydrogen fluoride, fluorine ($F_2$), adducts thereof, plasmas thereof, or any combinations thereof. The carrier gas can be or include hydrogen ($H_2$), nitrogen ($N_2$), forming gas (e.g., a mixture containing at least hydrogen and nitrogen), argon, helium, or any combination thereof.

In one or more embodiments, a method for forming a silicon-phosphorous material on a substrate is provided and includes exposing the substrate in a processing chamber to a deposition gas containing one or more silicon-phosphorous compounds during an epitaxy or epitaxial process and selectively depositing a film containing the silicon-phosphorous material on the substrate. The substrate can be positioned or otherwise contained in a processing chamber, such as an epitaxy chamber or CVD chamber, during the deposition process. The substrate can be heated to and/or maintained at a temperature of about 400° C., about 450° C., or about 500° C. to about 550° C., about 600° C., about 650° C., or about 700° C. during the deposition process. The processing chamber can be pressurized to and/or maintained at a pressure of about 20 Torr, about 50 Torr, about 80 Torr, about 100 Torr or about 150 Torr to about 200 Torr, about 250 Torr, about 300 Torr, about 400 Torr, about 500 Torr, about 600 Torr, or greater during the deposition process. In one or more examples, the substrate is heated to and/or maintained at a temperature of about 400° C. to about 700° C. and the processing chamber is pressurized to and/or maintained at a pressure of about 20 Torr to about 600 Torr during the deposition process.

In other embodiments, a method for forming a silicon-phosphorous material on a substrate is provided and includes exposing the substrate in a processing chamber to a deposition gas containing one or more silicon-phosphorous compounds during an ALD process and depositing a film containing the silicon-phosphorous material on the substrate. The substrate can be positioned or otherwise contained in a processing chamber, such as an ALD chamber, during the deposition process. The substrate can be heated to and/or maintained at a temperature of about 50° C., about 100° C., or about 150° C. to about 200° C., about 250° C., about 300° C., about 350° C., about 375° C., about 390° C., or less than about 400° C. during the deposition process. The processing chamber can be pressurized to and/or maintained at a pressure of about 0.001 Torr, about 0.01 Torr, or about 0.1 Torr to about 1 Torr, about 10 Torr, or about 100 Torr during the deposition process. In one or more examples, the substrate is maintained at a temperature of about 100° C. to less than 400° C. during the deposition process, and the processing chamber is maintained at a pressure of about 100 Torr or less during the deposition process.

In some embodiments, the deposition process can be controlled to deposit, grow, or otherwise produce one or more dielectric materials which include or contain the silicon-phosphorous material. For example, the silicon-phosphorous material can be or include silicon, phosphorous, oxygen, carbon, and nitrogen. In some examples, the silicon-phosphorous material can also include one or more dopants, such as arsenic, antimony, germanium, boron, or any combination thereof.

The deposited film or layer containing the silicon-phosphorous material can be deposited at a rate in a range from about 10 Å/min, about 20 Å/min, about 50 Å/min, or about 100 Å/min to about 150 Å/min, about 300 Å/min, about 500 Å/min, about 1,000 Å/min, about 1,500 Å/min, about 2,000 Å/min, such as, for example, from about 10 Å/min to about 2,000 Å/min. The silicon-phosphorous material can have a phosphorous concentration of about $1\times10^{20}$ atoms/cm$^3$, about $5\times10^{20}$ atoms/cm$^3$, or about $1\times10^{21}$ atoms/cm$^3$ to about $5\times10^{21}$ atoms/cm$^3$, about $1\times10^{22}$ atoms/cm$^3$, or about $5\times10^{22}$ atoms/cm$^3$. For example, the silicon-phosphorous material can have a phosphorous concentration in a range from about $1\times10^{20}$ atoms/cm$^3$ to about $5\times10^{22}$ atoms/cm$^3$, about $1\times10^{20}$ atoms/cm$^3$ to about $1\times10^{22}$ atoms/cm$^3$, or about $1\times10^{21}$ atoms/cm$^3$ to about $1\times10^{22}$ atoms/cm$^3$. The silicon-phosphorous material can have an arsenic concentration and/or another dopant concentration of about $1\times10^{20}$ atoms/cm$^3$, about $5\times10^{20}$ atoms/cm$^3$, or about $1\times10^{21}$ atoms/cm$^3$ to about $5\times10^{21}$ atoms/cm$^3$, about $1\times10^{22}$ atoms/cm$^3$, or about $5\times10^{22}$ atoms/cm$^3$. For example, the silicon-phosphorous material can have an arsenic concentration and/or another dopant concentration in a range from about $1\times10^{20}$ atoms/cm$^3$ to about $5\times10^{22}$ atoms/cm$^3$, about $1\times10^{20}$ atoms/cm$^3$ to about $1\times10^{22}$ atoms/cm$^3$, or about $1\times10^{21}$ atoms/cm$^3$ to about $1\times10^{22}$ atoms/cm$^3$.

The methods or processes described and disclosed herein may be performed in processing chambers configured to grow, form, deposit, or otherwise produce materials on substrates. It is understood that depositing silicon-phosphorous material, silicon, or other silicon materials on a monocrystalline silicon material to form an epitaxial layer of silicon-phosphorous material, silicon, or doped silicon thereon is known as growing an epitaxial layer. In one or more embodiments, the processing chambers are CENTURA® RP EPI chambers and PRODUCER® CVD chambers, commercially available from Applied Materials, Inc., of Santa Clara, Calif.

Benefits of the disclosure include deposition, formation, growth, or otherwise production of silicon-phosphorous materials as epitaxial layers/films, which can be used to form source and drain extensions with uniform doping at relatively low temperatures and with no ion implant damage and/or amorphization of the channel of the fin structure. Further benefits of the disclosure include the deposition, formation, growth, or otherwise production of silicon-phosphorous materials in or on source and drain extensions, source and drain features, contacts to the source and drain features. Other beneficial aspects provided by embodiments described and discussed here include: a relatively fast growth rate of the silicon-phosphorous materials; a relatively low deposition temperature (e.g., less than 500° C., such as about 450° C. or about 400° C.); a relative high concentration of phosphorous in the silicon-phosphorous materials which provides a relative low resistivity value of the silicon-phosphorous materials; and a stabilized phosphorus in the silicon-phosphorous materials (reduced phosphorous diffusion) due to the initial silicon-phosphorus bond in the silicon-phosphorous compound or precursor. In some examples, a relatively low deposition temperature of less than 500° C., can be about 400° C., about 420° C., about 435° C., or about 450° C. to about 460° C., about 480° C., about 490° C., or about 495° C.

In one or more embodiments, to facilitate control of a processing chamber for performing the methods describe and discussed herein (e.g., method for forming a silicon-phosphorous material on a substrate), a controller (not shown) can be one of any form of general-purpose computer processor that can be used in an industrial setting for controlling various processing chambers and sub-processors. The memory, or computer-readable medium (CRM), of a central processing unit (CPU) may be one or more of readily available memory such as random access memory (RAM), read only memory (ROM), floppy disk, hard disk, or any other form of digital storage, local or remote (not shown). The support circuits are coupled to the CPU for supporting the processor in a conventional manner. These circuits include cache, power supplies, clock circuits, input/output circuitry and subsystems, and the like (not shown).

The methods described and discussed herein may generally be stored in the memory as a computer program product or a software routine that, when executed by the CPU, causes the processing chamber to perform processes or methods described and discussed herein. The computer program product or software routine may also be stored and/or executed by a second CPU (not shown) that is remotely located from the hardware being controlled by the CPU. Some or all of the method may also be performed in hardware. As such, embodiments of the method may be implemented in software and executed using a computer system, in hardware as, e.g., an application specific integrated circuit or other type of hardware implementation, or as a combination of software and hardware. The computer program product or software routine may be executed after the substrate is positioned on the substrate support pedestal. The computer program product or software routine, when executed by the CPU, transforms the general purpose computer into a specific purpose computer (controller) that controls the chamber operation such that the methods described and disclosed herein are performed.

In one or more embodiments, the computer program product or software routine is residing on the CRM, and the computer program product or software routine includes instructions for causing the processor to perform one or more methods for forming the silicon-phosphorous material on the substrate as described and disclosed herein.

Embodiments of the present disclosure further relate to any one or more of the following paragraphs 1-32:

1. A method for forming a silicon-phosphorous material on a substrate, comprising: exposing the substrate to a deposition gas comprising a silicon-phosphorous compound during a deposition process; and depositing a film comprising the silicon-phosphorous material on the substrate, wherein the silicon-phosphorous compound has the chemical formula: $[(R_{3-v}H_vSi)—(R_{2-w}H_wSi)_n]_xPH_yR'_z$, and wherein: each instance of R is independently an alkyl or a halogen; each instance of R' is independently an alkyl or a halogen; n is 0, 1, or 2; v is 0, 1, 2, or 3; w is 0, 1, or 2; x is 1, 2, or 3; y is 0, 1, or 2; and z is 0, 1, or 2; wherein x+y+z=3.

2. A method for forming a silicon-phosphorous material on a substrate, comprising: exposing the substrate in a processing chamber to a deposition gas comprising a silicon-phosphorous compound during an epitaxial process; and selectively depositing a film comprising the silicon-phosphorous material on the substrate, wherein the substrate is heated to a temperature of about 400° C. to about 700° C.; wherein the processing chamber is maintained at a pressure of about 20 Torr to about 600 Torr; wherein the silicon-phosphorous compound has the chemical formula: $[(R_{3-v}H_vSi)—(R_{2-w}H_wSi)_n]_xPH_yR'_z$, and wherein: each instance of R is independently an alkyl or a halogen; each instance of R' is independently an alkyl or a halogen; n is 0, 1, or 2; v is 0, 1, 2, or 3; w is 0, 1, or 2; x is 1, 2, or 3; y is 0, 1, or 2; and z is 0, 1, or 2; wherein x+y+z=3.

3. A method for forming a silicon-phosphorous material on a substrate, comprising: exposing the substrate in a processing chamber to a deposition gas comprising a silicon-phosphorous compound during an atomic layer deposition process; and depositing a film comprising the silicon-phosphorous material on the substrate, wherein the substrate is heated to a temperature of about 100° C. to less than 400° C.; wherein the processing chamber is maintained at a pressure of about 100 Torr or less; wherein the silicon-phosphorous compound has the chemical formula: $[(R_{3-v}H_vSi)—(R_{2-w}H_wSi)_n]_xPH_yR'_z$, and wherein: each instance of R is independently an alkyl or a halogen; each instance of R' is independently an alkyl or a halogen; n is 0, 1, or 2; v is 0, 1, 2, or 3; w is 0, 1, or 2; x is 1, 2, or 3; y is 0, 1, or 2; and z is 0, 1, or 2; wherein x+y+z=3.

4. The method according to any one of paragraphs 1-3, wherein each instance of R is independently selected from the group consisting of methyl, ethyl, propyl, butyl, pentyl, fluoride, chloride, bromide, iodide, and an isomer thereof.

5. The method according to any one of paragraphs 1-4, wherein each instance of R' is independently selected from the group consisting of methyl, ethyl, propyl, butyl, pentyl, fluoride, chloride, bromide, iodide, and an isomer thereof.

6. The method according to any one of paragraphs 1-5, wherein each instance of R and each instance of R' are independently selected from methyl, ethyl, n-propyl, iso-propyl, n-butyl, sec-butyl, or tert-butyl.

7. The method according to any one of paragraphs 1-6, wherein n is 0, and wherein the silicon-phosphorous compound has the chemical formula $(R_{3-v}H_vSi)_xPH_yR'_z$.

8. The method of paragraph 7, wherein the silicon-phosphorous compound has a chemical formula selected from the group consisting of: $R_3Si—PR'_2$; $R_3Si—PHR'$; $R_3Si—PH_2$; $R_2HSi—PR'_2$; $R_2HSi—PHR'$; $R_2HSi—PH_2$; $RH_2Si—PR'_2$; $RH_2Si—PHR'$; $RH_2Si—PH_2$; $H_3Si—PR'_2$; $H_3Si—PHR'$; and $H_3Si—PH_2$.

9. The method of paragraph 7, wherein the silicon-phosphorous compound is selected from the group consisting of: $H_3Si—PH_2$; $Me_2HSi—PH_2$; $tBu_2HSi—PH_2$; $H_3Si—PMe_2$; $H_3Si—PEt_2$; $H_3Si—P(iPr)_2$; and $H_3Si—P(tBu)_2$.

10. The method of paragraph 7, wherein the silicon-phosphorous compound is selected from the group consisting of: $Cl_3Si—PMe_2$; $Cl_3Si—PEt_2$; $Cl_3Si—P(iPr)_2$; $Cl_3Si—P(tBu)_2$; $Br_3Si—PMe_2$; $Br_3Si—PEt_2$; $Br_3Si—P(iPr)_2$; and $Br_3Si—P(tBu)_2$.

11. The method according to any one of paragraphs 1-6, wherein n is 1, and wherein the silicon-phosphorous compound has the chemical formula $(R_{3-v}H_vSi)—(R_{2-w}H_wSi)—PH_yR'_z$.

12. The method of paragraph 11, wherein the silicon-phosphorous compound has a chemical formula selected from the group consisting of: $R_3Si—(R_2Si)—PR'_2$; $R_3Si—(R_2Si)—PHR'$; $R_3Si—(R_2Si)—PH_2$; $R_2HSi—(R_2Si)—PR'_2$; $R_2HSi—(R_2Si)—PHR'$; $R_2HSi—(R_2Si)—PH_2$; $RH_2Si—$ ($R_2Si$)—$PR'_2$; $RH_2Si$—($R_2Si$)—$PHR'$; $RH_2Si$—($R_2Si$)—$PH_2$; $H_3Si$—($R_2Si$)—$PR'_2$; $H_3Si$—($R_2Si$)—$PHR'$; $H_3Si$—($R_2Si$)—$PH_2$; $R_3Si$—($H_2Si$)—$PR'_2$; $R_3Si$—($H_2Si$)—$PHR'$; $R_3Si$—($H_2Si$)—$PH_2$; $R_2HSi$—($H_2Si$)—$PR'_2$; $R_2HSi$—($H_2Si$)—$PHR'$; $R_2HSi$—($H_2Si$)—$PH_2$; $RH_2Si$—($H_2Si$)—$PR'_2$; $RH_2Si$—($H_2Si$)—$PHR'$; $RH_2Si$—($H_2Si$)—$PH_2$; $H_3Si$—($H_2Si$)—$PR'_2$; $H_3Si$—($H_2Si$)—$PHR'$; $H_3Si$—($H_2Si$)—$PH_2$; $R_3Si$—($RHSi$)—$PR'_2$; $R_3Si$—($RHSi$)—$PHR'$; $R_3Si$—($RHSi$)—$PH_2$; $R_2HSi$—($RHSi$)—$PR'_2$; $R_2HSi$—($RHSi$)—$PHR'$; $R_2HSi$—($RHSi$)—$PH_2$; $RH_2Si$—($RHSi$)—$PR'_2$; $RH_2Si$—($RHSi$)—$PHR'$; $RH_2Si$—($RHSi$)—$PH_2$; $H_3Si$—($RHSi$)—$PR'_2$; $H_3Si$—($RHSi$)—$PHR'$; and $H_3Si$—($RHSi$)—$PH_2$.

13. The method according to any one of paragraphs 1-6, wherein x is 2; y is 0 or 1; and z is 0 or 1, where y+z=1, and wherein the silicon-phosphorous compound has the chemical formula $[(R_{3-v}H_vSi)—(R_{2-w}H_wSi)_n]_2PH_yR'_z$.

14. The method according to any one of paragraphs 1-6, wherein x is 3; y is 0; and z is 0, and wherein the silicon-phosphorous compound has the chemical formula $[(R_{3-v}H_vSi)—(R_{2-w}H_wSi)_n]_3P$.

15. The method according to any one of paragraphs 1-14, wherein the substrate is in a processing chamber during the deposition process, and wherein the silicon-phosphorous compound is produced in-situ the processing chamber prior to or during the deposition process.

16. The method according to any one of paragraphs 1-15, wherein the deposition process is an epitaxial process, an atomic layer deposition (ALD) process, a chemical vapor deposition (CVD) process, or a plasma process thereof.

17. The method according to any one of paragraphs 1-16, wherein the deposition gas further comprises one or more of a silicon source gas, a phosphorous source gas, an arsenic source gas, an antimony source gas, an etchant gas, a carrier gas, or any combination thereof.

18. The method of paragraph 17, wherein the silicon source gas comprises silane, disilane, trisilane, tetrasilane, chlorosilane, dichlorosilane, trichlorosilane, tetrachlorosilane, hexachlorodisilane, tetraethyl orthosilicate (TEOS), or any combination thereof.

19. The method of paragraph 17, wherein the phosphorous source gas comprises phosphine, trichlorophosphine, methylphosphine, ethylphosphine, propylphosphine, butylphosphine, dimethylphosphine, diethylphosphine, dipropylphosphine, dibutylphosphine, trimethylphosphine, triethylphosphine, tripropylphosphine, tributylphosphine, alkyl isomers thereof, adducts thereof, or any combination thereof.

20. The method of paragraph 17, wherein the arsenic source gas comprises arsine, methylarsine, ethylarsine, propylarsine, butylarsine, dimethylarsine, diethylarsine, dipropylarsine, dibutylarsine, trimethylarsine, triethylarsine, tripropylarsine, tributylarsine, alkyl isomers thereof, adducts thereof, or any combination thereof.

21. The method of paragraph 17, wherein the etchant gas comprises chlorine ($Cl_2$), hydrogen chloride, an alkylchloride, or any combinations thereof.

22. The method of paragraph 17, wherein the carrier gas comprises hydrogen ($H_2$), nitrogen ($N_2$), forming gas, a mixture of hydrogen and nitrogen, argon, helium, or any combination thereof.

23. The method according to any one of paragraphs 1-22, wherein the substrate is in a processing chamber during the deposition process, the substrate is heated to a temperature of about 400° C. to about 700° C. during the deposition process, and the processing chamber is maintained at a pressure of about 20 Torr to about 600 Torr during the deposition process.

24. The method according to any one of paragraphs 1-23, wherein the deposition process is an epitaxial process.

25. The method according to any one of paragraphs 1-24, wherein the substrate is in a processing chamber during the deposition process, the substrate is heated to a temperature of about 100° C. to less than 400° C. during the deposition process, and the processing chamber is maintained at a pressure of about 100 Torr or less during the deposition process.

26. The method according to any one of paragraphs 1-25, wherein the deposition process is an atomic layer deposition process.

27. The method according to any one of paragraphs 1-26, wherein the silicon-phosphorous material comprises silicon, phosphorous, oxygen, carbon, and nitrogen.

28. The method according to any one of paragraphs 1-27, wherein the film comprising the silicon-phosphorous material is deposited on a feature disposed on the substrate, and wherein the feature is a source-drain or a source-drain extension.

29. The method according to any one of paragraphs 1-28, wherein the silicon-phosphorous material comprises a phosphorous concentration in a range from about $1 \times 10^{20}$ atoms/$cm^3$ to about $1 \times 10^{22}$ atoms/$cm^3$.

30. The method according to any one of paragraphs 1-29, wherein the film comprising the silicon-phosphorous material is deposited at a rate in a range from about 10 Å/min to about 2,000 Å/min.

31. A computer program product residing on a computer-readable medium, the computer program product comprising instructions for causing a processor to perform the method according to any one of paragraphs 1-30.

32. A computer program product residing on a computer-readable medium, the computer program product comprising instructions for causing a processor to perform a method for forming a silicon-phosphorous material on a substrate, the method comprises: exposing the substrate to a deposition gas comprising a silicon-phosphorous compound during a deposition process; and depositing a film comprising the silicon-phosphorous material on the substrate, wherein the silicon-phosphorous compound has the chemical formula: $[(R_{3-v}H_vSi)—(R_{2-w}H_wSi)_n]_xPH_yR'_z$, and wherein: each instance of R is independently an alkyl or a halogen; each instance of R' is independently an alkyl or a halogen; n is 0, 1, or 2; v is 0, 1, 2, or 3; w is 0, 1, or 2; x is 1, 2, or 3; y is 0, 1, or 2; and z is 0, 1, or 2; wherein x+y+z=3.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

As described and discussed herein, the alkyl groups can have the following nomenclatures: methyl ($CH_3$— or Me), ethyl ($CH_3CH_2$— or Et), propyl (Pr) can be normal-propyl ($CH_3CH_2CH_2$— or nPr) or iso-propyl (($CH_3)_2CH$— or iPr), butyl (Bu) can be normal-butyl ($CH_3CH_2CH_2CH_2$— or nBu), sec-butyl ($CH_3CH_2(CH_3)CH$— or sBu), iso-butyl (($CH_3)_2CHCH_2$— or iBu), or tert-butyl (($CH_3)_3C$— or tBu).

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for forming a silicon-phosphorous material on a substrate, comprising:
   exposing the substrate to a deposition gas comprising a silicon-phosphorous compound during a deposition process; and
   depositing a film comprising the silicon-phosphorous material on the substrate,
   wherein the silicon-phosphorous compound has the chemical formula:

$R_2HSi—(R_2Si)—PR'_2$, and wherein:
   each instance of R is independently an alkyl or a halogen; and
   each instance of R' is independently an alkyl or a halogen.

2. The method of claim 1, wherein each instance of R and each instance of R' are independently selected from the group consisting of methyl, ethyl, propyl, butyl, pentyl, fluoride, chloride, bromide, iodide, and an isomer thereof.

3. The method of claim 1, wherein the substrate is in a processing chamber during the deposition process, and wherein the silicon-phosphorous compound is produced in-situ the processing chamber prior to or during the deposition process.

4. The method of claim 1, wherein the deposition gas further comprises one or more of a silicon source gas, a phosphorous source gas, an arsenic source gas, an antimony source gas, an etchant gas, a carrier gas, or any combination thereof.

5. The method of claim 4, wherein the silicon source gas comprises silane, disilane, trisilane, tetrasilane, chlorosilane, dichlorosilane, trichlorosilane, tetrachlorosilane, hexachlorodisilane, tetraethyl orthosilicate (TEOS), or any combination thereof.

6. The method of claim 4, wherein:
   the phosphorous source gas comprises phosphine, trichlorophosphine, methylphosphine, ethylphosphine, propylphosphine, butylphosphine, dimethylphosphine, diethylphosphine, dipropylphosphine, dibutylphosphine, trimethylphosphine, triethylphosphine, tripropylphosphine, tributylphosphine, alkyl isomers thereof, adducts thereof, or any combination thereof;
   the arsenic source gas comprises arsine, methylarsine, ethylarsine, propylarsine, butylarsine, dimethylarsine, diethylarsine, dipropylarsine, dibutylarsine, trimethylarsine, triethylarsine, tripropylarsine, tributylarsine, alkyl isomers thereof, adducts thereof, or any combination thereof;
   the etchant gas comprises chlorine ($Cl_2$), hydrogen chloride, an alkylchloride, or any combinations thereof; and
   the carrier gas comprises hydrogen ($H_2$), nitrogen ($N_2$), forming gas, a mixture of hydrogen and nitrogen, argon, helium, or any combination thereof.

7. The method of claim 1, wherein the deposition process is an atomic layer deposition (ALD) process, wherein the substrate is in a processing chamber during the ALD process, the substrate is heated to a temperature of about 100° C. to less than 400° C. during the ALD process, and the processing chamber is maintained at a pressure of about 100 Torr or less during the ALD process.

8. The method of claim 1, wherein the silicon-phosphorous material comprises silicon, phosphorous, oxygen, carbon, and nitrogen.

9. The method of claim 1, wherein the film comprising the silicon-phosphorous material is deposited on a feature disposed on the substrate, wherein the feature is a source-drain or a source-drain extension, and wherein the silicon-phosphorous material comprises a phosphorous concentration in a range from about $1\times10^{20}$ atoms/cm$^3$ to about $1\times10^{22}$ atoms/cm$^3$.

10. A method for forming a silicon-phosphorous material on a substrate, comprising:
    exposing the substrate in a processing chamber to a deposition gas comprising a silicon-phosphorous compound during an epitaxial process; and
    selectively depositing a film comprising the silicon-phosphorous material on the substrate,
    wherein the substrate is heated to a temperature of about 400° C. to about 700° C.;
    wherein the processing chamber is maintained at a pressure of about 20 Torr to about 600 Torr;
    wherein the silicon-phosphorous compound has the chemical formula:

$R_2HSi—(R_2Si)—PR'_2$, and wherein:
    each instance of R is independently an alkyl or a halogen; and
    each instance of R' is independently an alkyl or a halogen.

11. A method for forming a silicon-phosphorous material on a substrate, comprising:
    exposing the substrate in a processing chamber to a deposition gas comprising a silicon-phosphorous compound during an atomic layer deposition (ALD) process; and
    depositing a film comprising the silicon-phosphorous material on the substrate,
    wherein the substrate is heated to a temperature of about 100° C. to less than 400° C.;
    wherein the processing chamber is maintained at a pressure of about 100 Torr or less;
    wherein the silicon-phosphorous compound has the chemical formula:

$R_2HSi—(R_2Si)—PR'_2$, and wherein:
    each instance of R is independently an alkyl or a halogen; and
    each instance of R' is independently an alkyl or a halogen.

12. The method of claim 11, wherein each instance of R and each instance of R' are independently selected from the group consisting of methyl, ethyl, propyl, butyl, pentyl, fluoride, chloride, bromide, iodide, and an isomer thereof.

13. The method of claim 11, wherein the silicon-phosphorous compound is produced in-situ the processing chamber prior to or during the ALD process.

14. The method of claim 11, wherein the deposition gas further comprises one or more of a silicon source gas, a phosphorous source gas, an arsenic source gas, an antimony source gas, an etchant gas, a carrier gas, or any combination thereof.

15. The method of claim 14, wherein the silicon source gas comprises silane, disilane, trisilane, tetrasilane, chlorosilane, dichlorosilane, trichlorosilane, tetrachlorosilane, hexachlorodisilane, tetraethyl orthosilicate (TEOS), or any combination thereof.

16. The method of claim 14, wherein:
the phosphorous source gas comprises phosphine, trichlorophosphine, methylphosphine, ethylphosphine, propylphosphine, butylphosphine, dimethylphosphine, diethylphosphine, dipropylphosphine, dibutylphosphine, trimethylphosphine, triethylphosphine, tripropylphosphine, tributylphosphine, alkyl isomers thereof, adducts thereof, or any combination thereof;
the arsenic source gas comprises arsine, methylarsine, ethylarsine, propylarsine, butylarsine, dimethylarsine, diethylarsine, dipropylarsine, dibutylarsine, trimethylarsine, triethylarsine, tripropylarsine, tributylarsine, alkyl isomers thereof, adducts thereof, or any combination thereof;
the etchant gas comprises chlorine ($Cl_2$), hydrogen chloride, an alkylchloride, or any combinations thereof; and
the carrier gas comprises hydrogen ($H_2$), nitrogen ($N_2$), forming gas, a mixture of hydrogen and nitrogen, argon, helium, or any combination thereof.

17. The method of claim 11, wherein the silicon-phosphorous material comprises silicon, phosphorous, oxygen, carbon, and nitrogen.

18. The method of claim 11, wherein the film comprising the silicon-phosphorous material is deposited on a feature disposed on the substrate, wherein the feature is a source-drain or a source-drain extension, and wherein the silicon-phosphorous material comprises a phosphorous concentration in a range from about $1\times10^{20}$ atoms/cm$^3$ to about $1\times10^{22}$ atoms/cm$^3$.

* * * * *